United States Patent
Kimura

(10) Patent No.: US 6,605,869 B2
(45) Date of Patent: Aug. 12, 2003

(54) SEMICONDUCTOR DEVICE WITH IMPROVED COOLING EFFICIENCY AND REDUCED ELECTRIC RESISTANCE

(75) Inventor: Naoto Kimura, Kumamoto (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/115,524

(22) Filed: Apr. 3, 2002

(65) Prior Publication Data

US 2002/0140084 A1 Oct. 3, 2002

(30) Foreign Application Priority Data

Apr. 3, 2001 (JP) ........................................ 2001-104923

(51) Int. Cl.[7] .............................. H05K 7/20; H05K 3/36; H01L 23/48
(52) U.S. Cl. ..................... 257/723; 257/686; 257/685; 257/730; 257/777; 257/778; 257/668; 257/738; 257/737
(58) Field of Search ................................. 257/723, 730, 257/685, 686, 737, 734, 738, 778, 777, 668

(56) References Cited

U.S. PATENT DOCUMENTS

| 5,776,797 A | * | 7/1998 | Nicewarner, Jr. et al. ... 438/107 |
| 2002/0006040 A1 | * | 1/2002 | Kamada et al. ............. 362/237 |

FOREIGN PATENT DOCUMENTS

| JP | 58-114500 | 7/1983 |
| JP | 06-342991 | 12/1994 |

* cited by examiner

*Primary Examiner*—Alexander O. Williams
(74) *Attorney, Agent, or Firm*—Katten Muchin Zavis Rosenman

(57) ABSTRACT

The present invention provides a semiconductor device comprising: a tape wiring substrate; a semiconductor element mounted one main surface of the tape wiring substrate; a solder ball or pump electrode provided on the other surface of the tape wiring substrate while electrically connected with a predetermined position of the main surface of the tape wiring substrate including the semiconductor element; and a hollow pipe-shaped substrate; wherein the tape wiring substrate is wound around the hollow pipe-shaped substrate with the main surface arranged toward the hollow pipe-shaped substrate.

6 Claims, 4 Drawing Sheets

SEMICONDUCTOR DEVICE WITH IMPROVED COOLING EFFICIENCY AND REDUCED ELECTRIC RESISTANCE

BACKGROUND OF THE INVENTION

1. Field of the Invention

The present invention relates to a semiconductor integrated circuit layout method and in particular, to a semiconductor device capable of improving cooling efficiency with a high integration density and reducing electric resistance as well as increasing the assembling efficiency.

2. Description of the Prior Art

Conventionally, there have been suggested various semiconductor devices capable of improving cooling efficiency with a high integration density. For example, Japanese Patent Publication 58-114500 discloses a semiconductor device as shown in FIG. 6. In FIG. 6, on each of unit substrates 41, a semiconductor device 42 connected to a lead 43 is mounted. The units substrates are arranged in matrix shape (honeycomb shape) and the leads between the unit substrates are connected to each other via connectors (not depicted). In space 44 between the unit substrates thus assembled, coolant is flown so as to cool the semiconductor device 42.

Moreover, Japanese Patent Publication 6-342991 discloses a semiconductor device as shown in FIG. 7. In FIG. 7, prolonged main body substrates 51 having a hexagonal end face are bundled and semiconductor devices 52 are mounted on the outer exposed surface. On the hexagonal surface of the main body substrates 51, a lead 53 is formed to be connected to the semiconductor device 52. Moreover, leads 53 of the adjacent substrates are connected in contact with each other. And coolant is flown through a hollow center 54 of the prolonged main body substrate 51 so as to cool the semiconductor device 52.

In the conventional technique shown in FIG. 6, coolant is flown inside and the semiconductor device can be cooled down. However, leads are used for connection between the semiconductor devices, which increases electric resistance. Moreover, a plenty of unit substrates are assembled to form a space for flowing the coolant and connectors are used for connection between the unit substrates. Thus, a plenty of assembling steps are required. Furthermore, since each semiconductor device is mounted separately, the number of assembling steps is further increased.

On the other hand, in the conventional technique as shown in FIG. 7, the coolant flown inside can cool down the semiconductor device. However, in the same way as in FIG. 6, since leads are used for connection between the semiconductor devices, the electric resistance is increased. Moreover, since each semiconductor device is separately mounted, the number of assembling steps is increased. Furthermore, the semiconductor devices are mounted only on the outer exposed surface of the bundled main body substrates and accordingly, it is impossible to realize a higher integration density.

It is therefore an object of the present invention to provide a semiconductor device capable of sufficiently cooling the semiconductor device, reducing the electric resistance, realizing a high integration density, and reducing the number of assembling steps.

BRIEF SUMMARY OF THE INVENTION

Object of the Invention

It is therefore an object of the present invention to provide a semiconductor device capable of sufficiently cooling the semiconductor device, reducing the electric resistance, realizing a high integration density, and reducing the number of assembling steps.

Summary of the Invention

The present invention provides a semiconductor device comprising: a tape wiring substrate; a semiconductor device mounted on one main side of the tape wiring substrate; a solder ball or bump electrode electrically connected with a predetermined position of the one main side of the tape wiring substrate including the semiconductor device and provided on the other side of the tape wiring substrate; and a hollow pipe-shaped substrate; wherein the tape wiring substrate is wound on the hollow pipe-shaped substrate with the one main side directed to the hollow pipe-shape substrate.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Description will now be directed to embodiments of the present invention with reference to the attached drawings.

Figure 1:
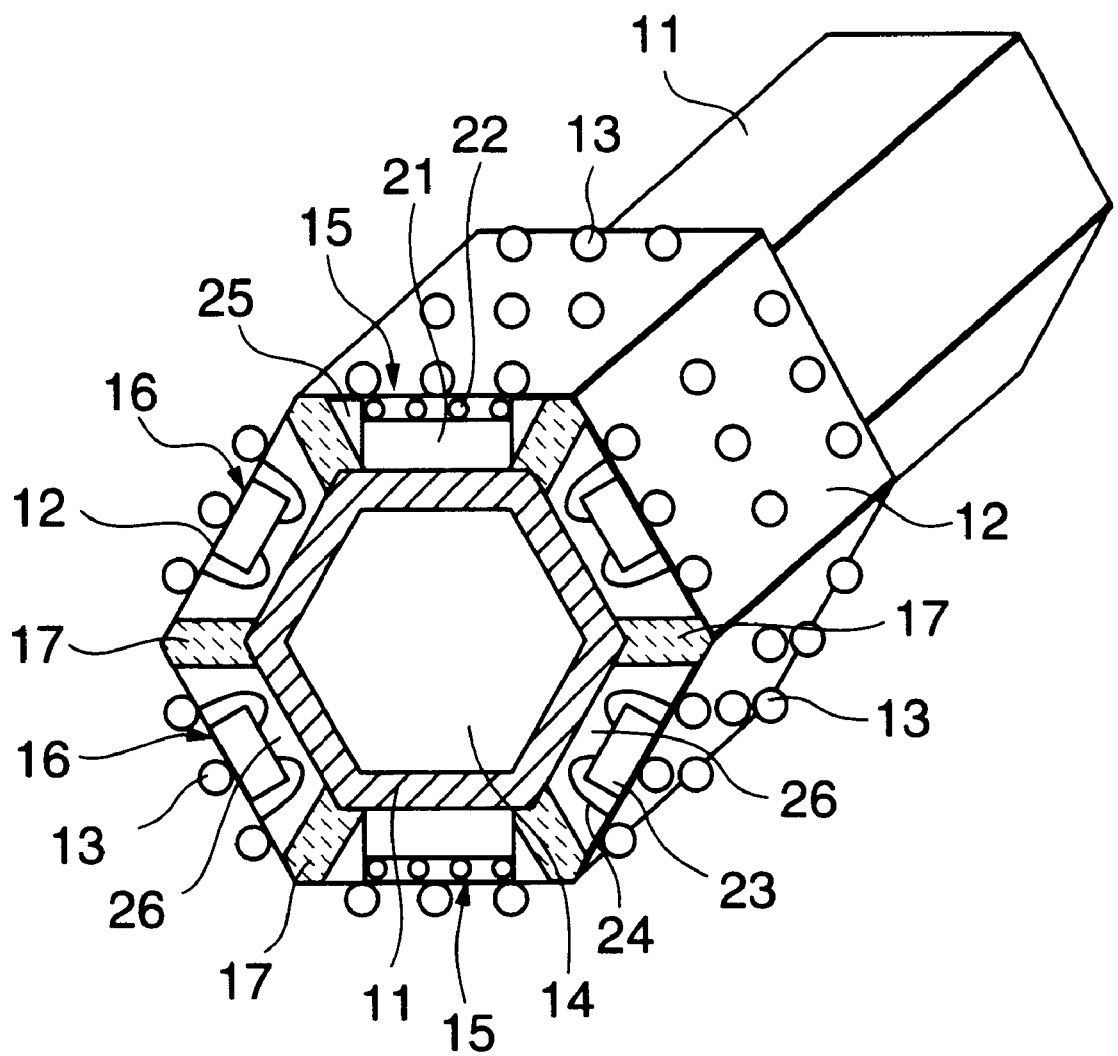
FIG. 1 a semiconductor device according to a first embodiment of the present invention.

FIG. 1 is a perspective view of a semiconductor device according to a first embodiment of the present invention including a cross sectional end surface. A tape wiring substrate 12 is wound around a hollow pipe-shaped substrate 11 having a hexagonal outer shape.

Inside the tape wiring substrate (shown a thick line) are mounted a flip-chip type semiconductor element 15 and a wire type semiconductor element 16. These elements have their upper surfaces pushed against the six outer walls of the hollow pipe-shaped substrate 11 and between them, adhesive resin 17 is molded. This tape wiring substrate 12 is a tape made from a flexible film such as a polyimide film.

The flip-chip type semiconductor element 15 is composed of a semiconductor chip 21 and a solder ball or a bump electrode 22 and a sealing resin 25. The semiconductor chip 21 has an upper surface exposed from the sealing resin 25 to be in direct contact with the outer wall of the hollow pipe-shaped substrate 11.

The wire type semiconductor element 16 is composed of a semiconductor chip 23, a bonding wire 24, and a sealing resin 26 constituting the package. The sealing resin 26 constituting the package has its upper surface in direct contact with the outer wall of the hollow pipe-shaped substrate 11.

On the other hand, outside the wound tape wiring substrate 12, there is provided a solder ball or a bump electrode 13. This solder ball or bump electrode 13 is electrically connected with a predetermined position inside the tape wiring substrate 12 including the semiconductor elements 15 and 16.

Spaces between the semiconductor elements 15, 16, the hollow pipe-shaped substrate 11, and the tape wiring substrate 12 are filled with adhesive resin 17 which is different from the resin 25, 26 constituting the package, thereby making the components as a unitary block.

Moreover, the hollow pipe-shaped substrate 11 having a length greater than the width of the tape wiring substrate 12 has a hollow center as a coolant path 14 where a cooling gas and a cooling liquid are flown so as to cool down the semiconductor element.

Figure 2:
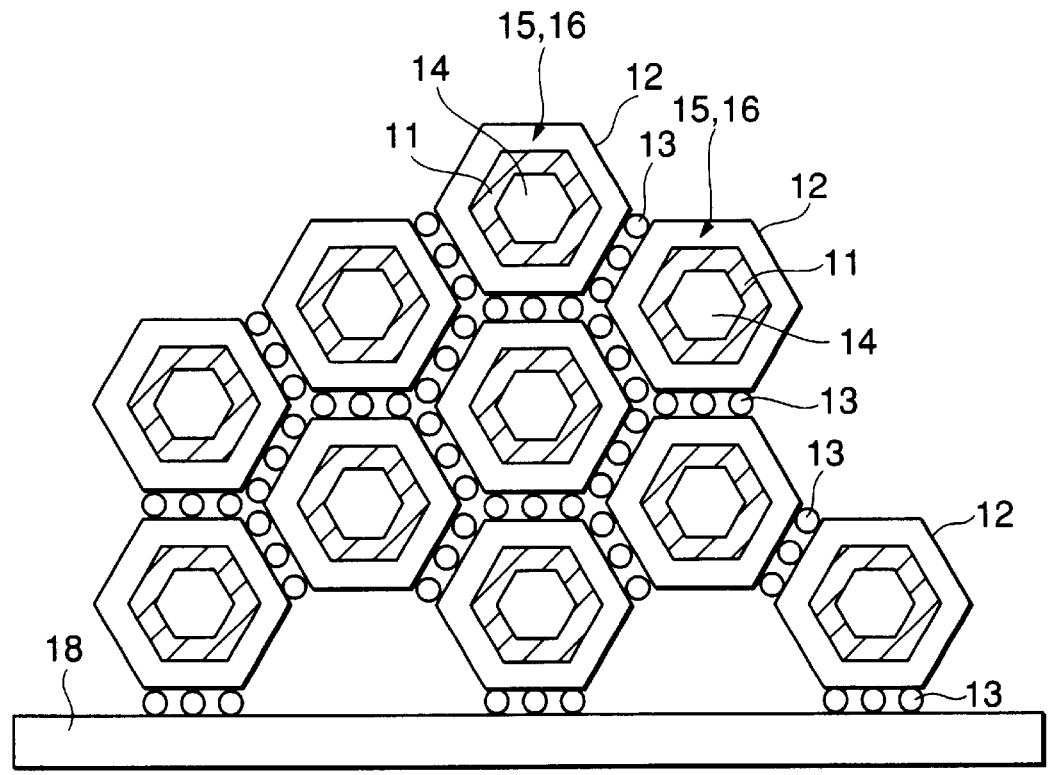
FIG. 2 a semiconductor device according to a second embodiment of the present invention.

FIG. 2 is a front view of a semiconductor device according to a second embodiment of the present invention. It should be noted that like elements as in FIG. 1 are denoted by like reference symbols and their explanations are omitted. Moreover, to prevent complicated representation, in FIG. 2, the semiconductor elements 15, 16 are not depicted.

In FIG. 2, a plurality of the structures shown in FIG. 1 are stacked one on another and the solder ball or bump electrode 13 of the tape wiring substrate (shown by a thick line) 12 wound around the hollow pipe-shaped substrate 11 is connected to the solder ball or bump electrode 13 of the tape wiring substrate 12 wound on the adjacent hollow pipe-shaped substrate 11 and lowermost solder ball or bump electrode 13 in the figure is connected to a predetermined position of a wiring pattern (not depicted) formed on the wiring substrate 18, thereby reducing the electric resistance.

Next, referring to FIG. 3 to FIG. 5, explanation will be given on the production method of the embodiments of the present invention.

Figure 3:
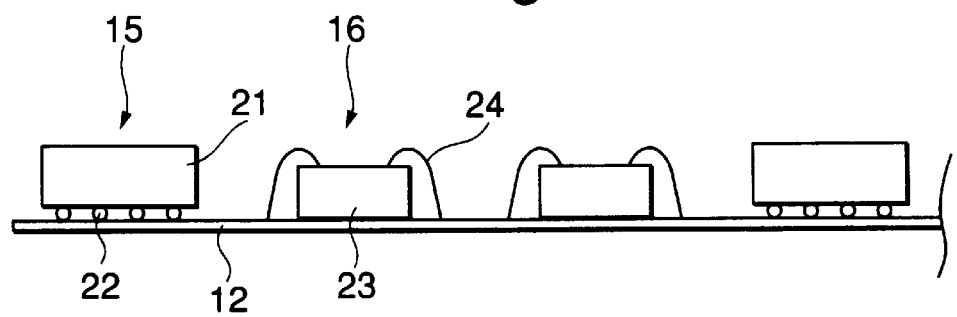
FIG. 3 shows a production step of the semiconductor device production method according to the embodiment of the present invention.

Firstly, as shown in FIG. 3, a wiring pattern is formed on a main surface of a flexible tape such as a polyimide film so as to constitute the tape wiring substrate 12 having one main surface (upper surface in Figure) on which the semiconductor elements 15, 16 are mounted. When the semiconductor elements are flip-chip type semiconductor 15, the solder ball or the bump electrode 22 is connected to a predetermined position of the wiring pattern of the tape wiring substrate 12. When the semiconductor element is a wire type semiconductor element 16, a bonding wire 24 is used to connect the electrode pad of the semiconductor chip 23 to a predetermined position of the wiring pattern of the tape wiring substrate 12.

Figure 4:
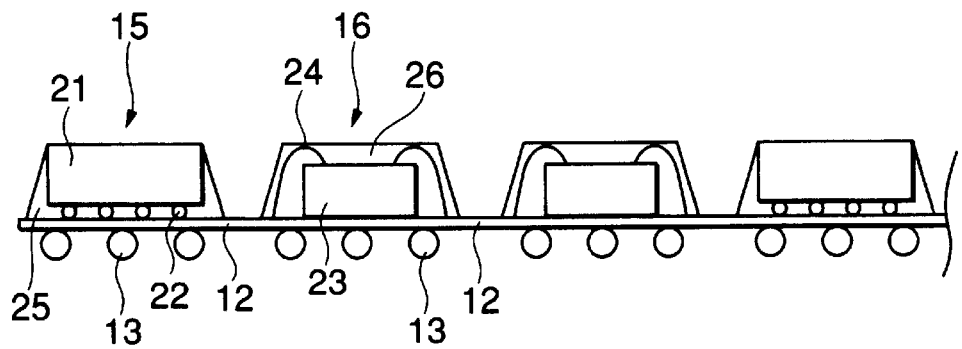
FIG. 4 shows a step after the step of FIG. 3.

Next, as shown in FIG. 4, when the semiconductor element is the flip-chip type semiconductor element 15, the sealing resin 25 is molded so as to expose the upper surface of the semiconductor chip 21. Moreover, when the semiconductor element is the wire type semiconductor element 16, sealing resin 26 is used to perform molding so that the entire surface is covered.

Then, a solder ball or bump electrode 13 is formed on the other surface (lower surface in the figure) of the tape wiring substrate 12. This solder ball or bump electrode 13 is electrically connected with the upper surface of the tape wiring substrate 12 including the semiconductor elements 15, 16.

Figure 5:
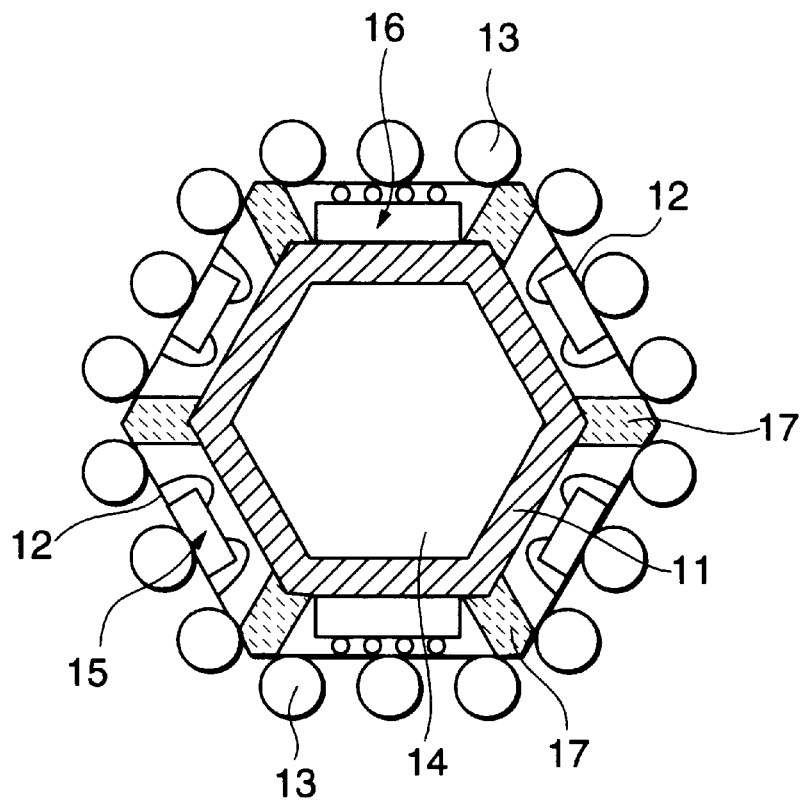
FIG. 5 shows a step after the step of FIG. 4.
Figure 6:
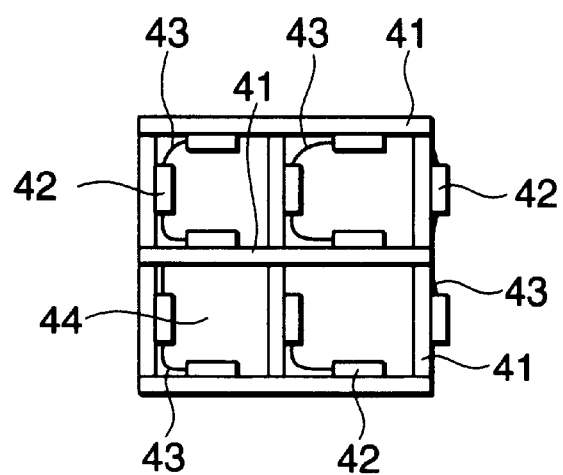
FIG. 6 shows a semiconductor device according to the conventional technique.
Figure 7:
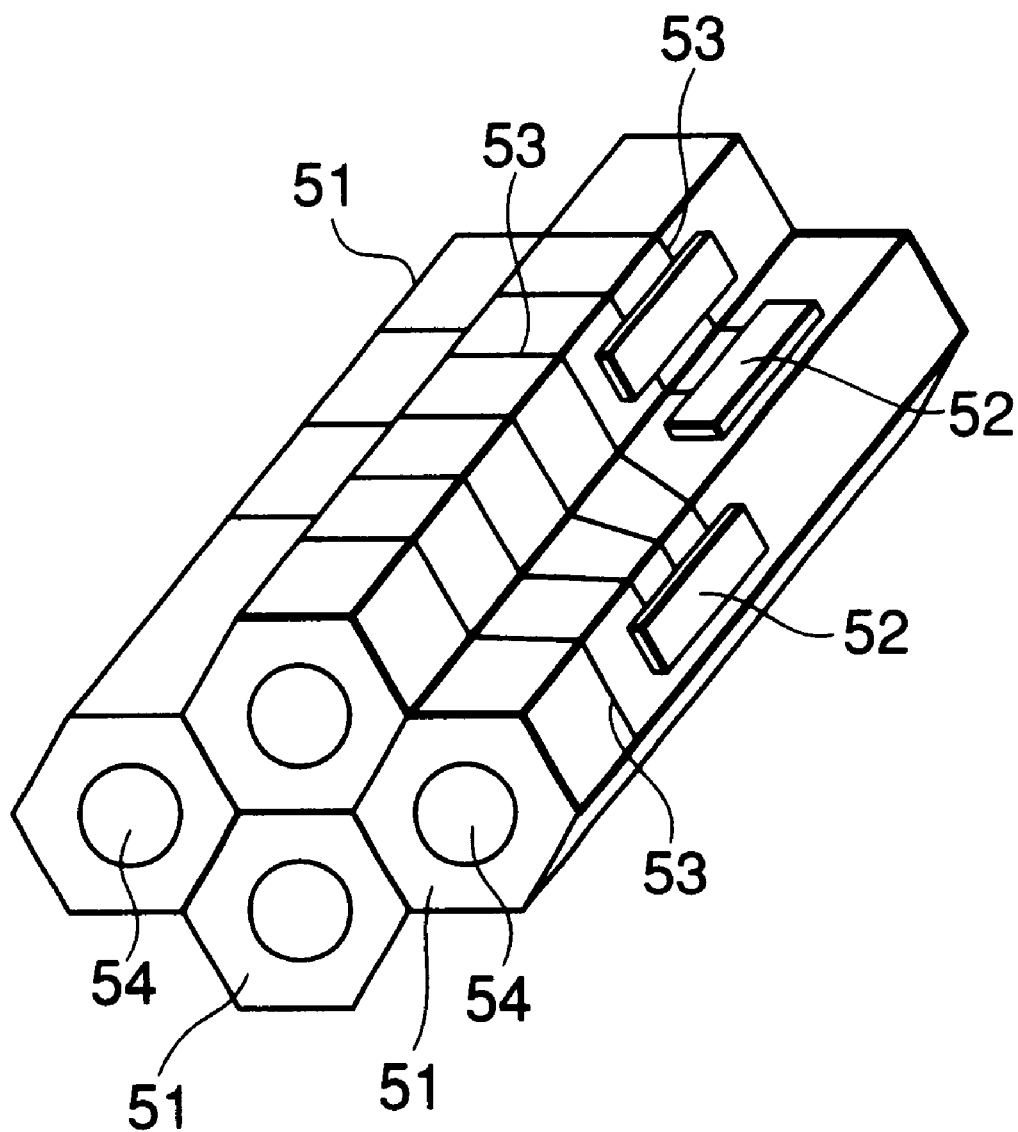
FIG. 7 shows another semiconductor device according to the conventional technique.

Next, as shown in FIG. 5, the tape wiring substrate 12 is wound on the hollow pipe-shaped substrate 11 with the aforementioned main surface inside. It should be noted that in FIG. 5, the tape wiring substrate 12 is shown by a thick line as in FIG. 1 and FIG. 2.

Spaces between the semiconductor elements 15, 16 and the hollow pipe-shaped substrate 11, and the tape wiring substrate 12 are filled with an adhesive resin 17 which is different from the resin 25, 26 constituting the package, thereby obtaining a unitary block.

According to this invention, since connection is made by using the solder ball or bump electrode on the hollow pipe-shaped substrate, the connection is shortest, thereby reducing the electric resistance. Especially by connecting the solder balls or bump electrodes on the different hollow pipe-shaped substrates, it is possible to make a plurality of hollow pipe-shaped substrates wound with the tape wiring substrate into a unitary block and accordingly, it is possible to reduce the electric resistance between the semiconductor elements on the different hollow pipe-shaped substrates.

Moreover, the tape wiring substrate is wound around the hollow pipe-shaped substrate with one of its main surfaces facing to the hollow pipe-shaped substrate, thereby mounting the semiconductor elements on the hollow pipe-shaped substrate. This significantly improves the work efficiency.

Furthermore, since the semiconductor element can be arranged over all the outer periphery of the hollow pipe-shaped substrate, the semiconductor device can increase its mounting density.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor device comprising:
   a tape wiring substrate;
   a semiconductor element mounted on a main surface of the tape wiring substrate;
   a solder ball or bump electrode provided on the other surface of the tape wiring substrate while electrically connected with a predetermined position of the main surface of the tape wiring substrate including the semiconductor element; and
   a hollow pipe-shaped substrate;
   wherein the tape wiring substrate is wound around the hollow pipe-shaped substrate with the main surface arranged toward the hollow pipe-shaped substrate.

2. The semiconductor device according to claim 1, wherein the hollow pipe-shaped substrate has a hexagonal outer shape.

3. The semiconductor device according to claim 1, wherein a plurality of the hollow pipe-shaped substrate each wound with the tape wiring substrate are provided, and a solder ball or bump electrode of a tape wiring substrate wound around a first hollow pipe-shaped substrate is in abutment with and connected to a solder ball or bump electrode of a tape wiring substrate wound on a second hollow pipe-shaped substrate adjacent tot he first hollow pipe-shaped substrate.

4. The semiconductor device according to claim 1, wherein spaces between the semiconductor elements and the hollow pipe-shaped substrates and the tape wiring substrates are filled with resin.

5. The semiconductor device according to claim 1, wherein coolant flows through the hollow center of the hollow pipe-shaped substrate.

6. The semiconductor device according to claim 1, wherein the solder ball or the bump electrode is mounted with connection to the wiring of the wiring substrate.

* * * * *